United States Patent
Greer et al.

(10) Patent No.: US 10,170,654 B2
(45) Date of Patent: Jan. 1, 2019

(54) SOLAR POWERED DEVICE WITH SCALABLE SIZE AND POWER CAPACITY

(71) Applicant: SAGE Electrochromics, Inc., Faribault, MN (US)

(72) Inventors: Bryan D. Greer, Northfield, MN (US); Mark O. Snyker, Apple Valley, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 16 days.

(21) Appl. No.: 14/743,534

(22) Filed: Jun. 18, 2015

(65) Prior Publication Data

US 2015/0378231 A1    Dec. 31, 2015

Related U.S. Application Data

(60) Provisional application No. 62/016,820, filed on Jun. 25, 2014.

(51) Int. Cl.
  *G02F 1/153*    (2006.01)
  *H01L 31/042*    (2014.01)
  (Continued)

(52) U.S. Cl.
  CPC ............... *H01L 31/042* (2013.01); *E06B 9/24* (2013.01); *H02S 20/22* (2014.12); *H02S 40/38* (2014.12);
  (Continued)

(58) Field of Classification Search
  CPC .......... G02F 1/163; G02F 1/155; G02F 1/153; G02F 1/1533; G02F 1/157; G02F 1/15;
  (Continued)

(56) References Cited

U.S. PATENT DOCUMENTS

| | | |
|---|---|---|
| 4,294,038 A | 10/1981 | Davidson |
| 5,063,717 A | 11/1991 | Quaranta et al. |

(Continued)

FOREIGN PATENT DOCUMENTS

| | | |
|---|---|---|
| EP | 0328049 B1 | 2/1989 |
| JP | S60-073990 A | 4/1985 |

(Continued)

OTHER PUBLICATIONS

International Search Report and Written Opinion for PCT Application No. PCT/US2015/036458, dated Sep. 11, 2015, 12 pages.

(Continued)

*Primary Examiner* — Thomas K Pham
*Assistant Examiner* — Sharrief Broome
(74) *Attorney, Agent, or Firm* — Abel Law Group, LLP; Robert N Young

(57) ABSTRACT

A window transmissivity control assembly having a power source with scalable size and power capacity is provided. The assembly includes an insulated glazing unit including a variably transmissive glazing, a photovoltaic module attached to the insulated glazing unit and electrically coupled to the variably transmissive glazing, and a control module having a control circuit for controlling transmissivity of the glazing and a battery for providing power to the glazing. The photovoltaic assembly is attached to an exterior face portion of the insulated glazing unit, and a control module is attached to an interior face portion of the insulated glazing unit. Each module may extend from a first end of the insulated glazing unit to an opposing second end of the insulated glazing unit, wherein the length of the module being substantially the same as the distance between the first and second ends of the insulated glazing unit.

20 Claims, 5 Drawing Sheets

(51) Int. Cl.
*E06B 9/24* (2006.01)
*H02S 40/38* (2014.01)
*H02S 20/22* (2014.01)
*G02F 1/163* (2006.01)

(52) U.S. Cl.
CPC ............... *E06B 2009/2464* (2013.01); *E06B 2009/2476* (2013.01); *G02F 1/163* (2013.01); *Y02E 10/50* (2013.01)

(58) Field of Classification Search
CPC ............... G02F 1/161; G02F 1/1523; G02F 2001/1555; G02F 2001/1515; G02F 1/1521; G02F 2001/1536; G02F 1/13318; G02F 1/133512; G02F 1/1525; G02F 2001/1512
See application file for complete search history.

(56) References Cited

U.S. PATENT DOCUMENTS

| | | | |
|---|---|---|---|
| 5,384,653 A | 1/1995 | Benson et al. | |
| 6,055,089 A | 4/2000 | Schulz | |
| 6,297,900 B1* | 10/2001 | Tulloch | E06B 9/24 359/265 |
| 6,406,090 B1 | 6/2002 | Tolinski et al. | |
| 7,372,610 B2 | 5/2008 | Burdis et al. | |
| 8,482,837 B2 | 7/2013 | Sbar et al. | |
| 8,482,838 B2 | 7/2013 | Sbar et al. | |
| 9,250,494 B2 | 2/2016 | Podbelski | |
| 2003/0098056 A1 | 5/2003 | Fronek et al. | |
| 2004/0061819 A1 | 4/2004 | Faris et al. | |
| 2008/0169185 A1 | 7/2008 | Burdis et al. | |
| 2010/0006865 A1* | 1/2010 | Nakata | H01L 25/0753 257/88 |
| 2011/0148218 A1 | 6/2011 | Rozbicki | |
| 2011/0180122 A1 | 7/2011 | Tanner et al. | |
| 2012/0194895 A1 | 8/2012 | Podbelski et al. | |
| 2013/0025673 A1* | 1/2013 | Huebel | C25D 5/028 136/256 |
| 2013/0063802 A1* | 3/2013 | Varaprasad | B60R 1/089 359/275 |
| 2014/0003038 A1 | 1/2014 | Kim et al. | |
| 2014/0083028 A1 | 3/2014 | Richardson | |
| 2016/0197220 A1 | 7/2016 | Greer et al. | |

FOREIGN PATENT DOCUMENTS

| | | |
|---|---|---|
| JP | S60-124717 U | 7/1985 |
| JP | S60-148983 A | 8/1985 |
| JP | H01-059226 U | 12/1985 |
| JP | S60-253688 A | 12/1985 |
| JP | S62115416 A | 5/1987 |
| JP | S63116830 A | 5/1988 |
| JP | H08184273 A | 7/1996 |
| JP | H10-227102 A | 8/1998 |
| JP | 2002-148573 A | 5/2002 |
| JP | 2002221581 A | 8/2002 |
| JP | 2004012818 A | 1/2004 |
| JP | 2014-505905 A | 3/2014 |
| WO | 2011108334 A1 | 9/2011 |
| WO | 2013109881 A2 | 7/2013 |
| WO | 2014032023 A1 | 2/2014 |
| WO | 2016111917 A1 | 7/2016 |

OTHER PUBLICATIONS

International Search Report and Written Opinion for PCT/US2016/012025, dated Mar. 24, 2016, 15 pages.

* cited by examiner

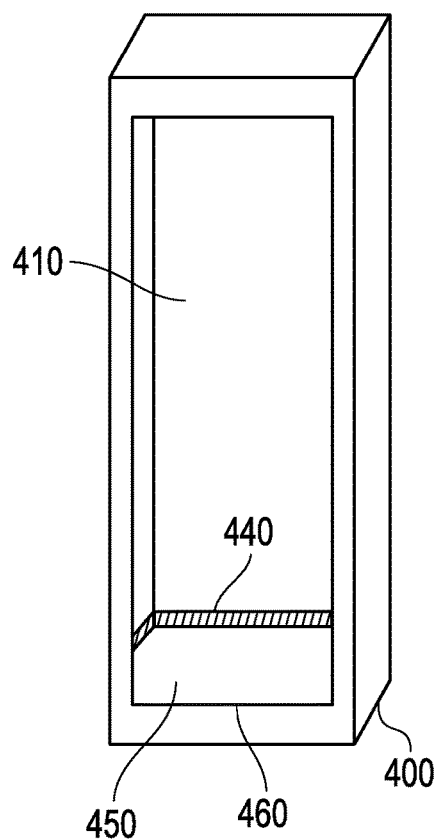
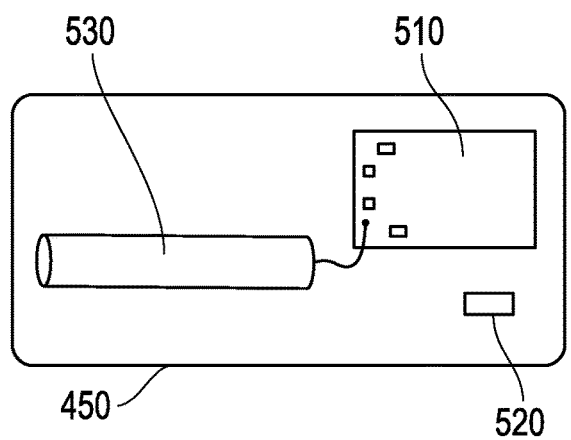
FIG. 4
FIG. 5

SOLAR POWERED DEVICE WITH SCALABLE SIZE AND POWER CAPACITY

CROSS-REFERENCE TO RELATED APPLICATION

The current application claims priority from U.S. Provisional Patent Application No. 62/016,820, filed Jun. 25, 2014, entitled "Solar Powered Device With Scalable Size And Power Capacity," naming as inventors Bryan D. Greer et al., which is incorporated by reference herein in its entirety.

BACKGROUND

Electrochromic glazings include electrochromic materials that are known to change their optical properties, such as coloration, in response to the application of an electrical potential. For example, the glazing may become more or less transparent or more or less opaque. Typical electrochromic devices include a counter electrode layer, an electrochromic material layer which is deposited substantially parallel to the counter electrode layer, and an ionically conductive layer separating the counter electrode layer from) the electrochromic layer respectively. In addition, two transparent conductive layers are substantially parallel to and in contact with one of each the counter electrode layer and the electrochromic layer. Materials for making the counter electrode layer, the electrochromic material layer, the ionically conductive layer and the conductive layers are known and described, for example, in U.S. Pat. No. 7,372,610, incorporated by reference herein, and desirably are substantially transparent oxides or nitrides.

When an electrical potential is applied across the layered structure of the electrochromic device, such as by connecting the respective conductive layers to a low voltage electrical source, ions, such as $Li^+$ ions stored in the counter electrode layer, flow from the counter electrode layer, through the ion conductor layer and to the electrochromic layer. In addition, electrons flow from the counter electrode layer, around an external circuit including a low voltage electrical source, to the electrochromic layer so as to maintain charge neutrality in the counter electrode layer and the electrochromic layer. The transfer of ions and electrons to the electrochromic layer causes the optical characteristics of the electrochromic layer, and optionally the counter electrode layer in a complementary EC device, to change, thereby changing the coloration and, thus, the transparency of the electrochromic device.

When installing electrochromic glazings, installing wires for power and control through the building's window framing system and the building's structural systems/supports can be difficult and costly. It is believed that a well-designed wireless controller coupled with photovoltaic cells can dramatically reduce the cost and complexity of installation, especially for architectural retrofit applications. The combination of photovoltaics and electrochromics provides excellent synergies, with tinting generally required only in daylight. Designing such a product for ease of manufacture and installation presents many challenges, given the diversity of framing systems and stringent aesthetic requirements of architects. To complicate matters, electronics should be replaceable without replacing or deglazing the unit and, if a battery is used, it also needs to be user replaceable.

Some electrochromic glazings are powered by solar-energy with or without battery back-up. Solar energy power sources, such as photovoltaic (solar) cells, and battery power sources come in a variety of sizes and power capacities. It is believed that the largest available solar cells and/or batteries are used to power a glazing may be too physically large or costly for relatively small scale applications. Furthermore, it may be costly to custom make solar panels for any given size as needed. Using a standard sized solar panel for a range of devices may be suitable from a power requirements standpoint, but the appearance of such a solar panel may not be aesthetically acceptable. There is, therefore, a needed for a solution that provides solar power (and battery power) devices that are scalable both in terms of power capacity and size and that are further suitable for a range of different sized and/or shaped glazings, without requiring custom design or manufacture.

BRIEF SUMMARY

One aspect of the present disclosure is a photovoltaic assembly having an insulated glazing unit with a variably transmissive glazing and a photovoltaic module attached to the insulated glazing unit and electrically coupled to the variably transmissive glazing. The photovoltaic module may extend from a first end of the insulated glazing unit to an opposing second end of the insulated glazing unit, and the length of the photovoltaic module may be substantially the same as the distance between the first and second ends of the insulated glazing unit.

Another aspect of the disclosure is a window transmissivity control assembly including the above described photovoltaic assembly attached to an exterior face portion of the insulated glazing unit, and a control module attached to an interior face portion of the insulated glazing unit. The control module may further include a control circuit for controlling transmissivity of the glazing, and a battery for providing power to the glazing.

In some examples, the photovoltaic module may overlay and be electrically coupled to the variably transmissive glazing, while extending from a first end of the glazing to an opposing second end of the glazing, such that the length of the photovoltaic module is substantially the same as the distance between the first and second ends of the glazing. In other embodiments, the insulated glazing unit may include a frame, the frame at least partially enclosing the glazing, and the first and second ends of the insulated glazing unit would be the opposing ends of the frame. In such examples, the photovoltaic module may be attached to the frame.

Yet a further aspect of the disclosure provides for a window transmissivity control assembly having a photovoltaic power source electrically coupled to an insulated glazing unit, and a battery power source electrically coupled to the insulated glazing unit. The photovoltaic power source may include a plurality of solar cell wafers having a common width, the plurality of solar cell wafers being coupled to one another lengthwise to form a solar cell array having that common width. The battery power source may also include a plurality of battery modules having a common length and a common diameter. The length dimension of the solar cell wafers is substantially parallel to the length dimension of the battery modules. In some examples, the common length dimension of the solar cell wafers and battery modules may be arranged substantially parallel to a width dimension of the insulated glazing unit.

The assemblies described herein may be installed into or onto any one of a building façade, an architectural skylight, and a vehicle.

BRIEF DESCRIPTION OF THE DRAWINGS

Embodiments are illustrated by way of example and are not limited in the accompanying figures.

FIG. 4 is an interior partial perspective view of an insulated glazing unit ("IGU") in accordance with an aspect of the disclosure.

FIG. 5 is a schematic view of a controller module in accordance with an aspect of the disclosure.

Figure 1A:
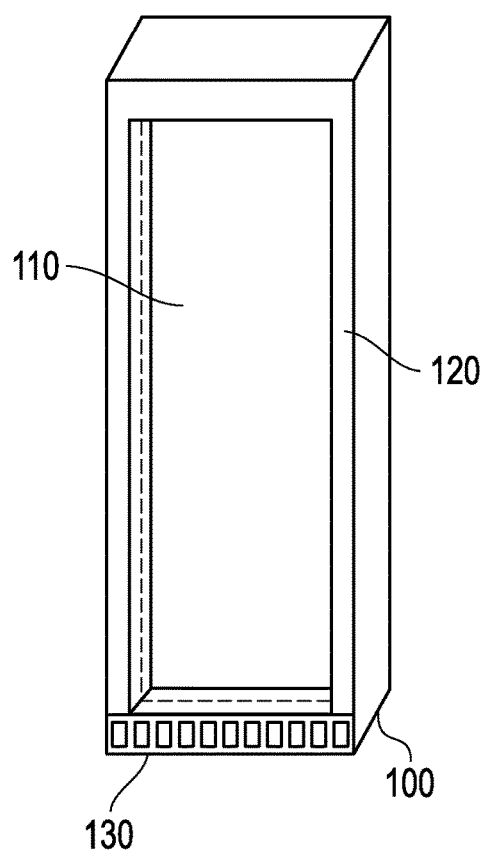
FIGS. 1A-1D are exterior perspective views of insulated glazing units ("IGUs") in accordance with an aspect of the disclosure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the electrochromic, window, and glazing arts.

The present disclosure is directed to electrochromic systems comprising an electrochromic glazing or insulated glazing unit (hereinafter "IGU"), a photovoltaic (hereinafter "PV") module for supplying power to the electrochromic glazing or IGU, and an controller module, including control electronics, wireless communication electronics, and a battery power source, in communication with either the electrochromic glazing unit and/or photovoltaic module.

"Insulated glazing units," as that term is used herein, means two or more layers of glass separated by a spacer along the edge and sealed to create a dead air (or other gas, e.g., argon, nitrogen, krypton) space between the layers. The terms "electrochromic glazing" or "IGU" are used interchangeably herein. The electrochromic glazing may include a laminate structure (see U.S. Pat. Nos. 8,482,837 and 8,482,838, the disclosures of which are hereby incorporated by reference herein in their entireties).

The electrochromic glazing and/or IGU are typically used for architectural purposes, e.g., architectural windows in buildings. As such, the electrochromic glazings or IGUs are installed within a window pane or other type of building frame-work (collectively referred to herein as "frame-work" or "building frame-work"). As those skilled in the art will recognize, the building frame-work often includes a frame cap on the exterior of the frame. A frame cap is, generally, an aesthetic extrusion which is mounted onto the frame near the end of the assembly process, and which can be removed later.

FIG. 1A depicts a perspective view of an IGU 100 from an exterior side of the IGU. The IGU 100 may be installed into the façade of a building (not shown) such that the exterior side is incident to sunlight during at least part of the day. The IGU 100 includes a glazing 110 having variable transmittance properties, such as an electrochromic ("EC") glazing, and a frame 120 encasing the glazing 110. The IGU 100 further includes a PV module 130. The PV module 130 is attached to the IGU 100 along the frame 120, and spans substantially the entire width of the IGU 100, from one end of the IGU to the opposing end. The PV module 130 may be attached by use of adhesive (e.g., double sided tape), mounted using screws or snaps, or by any other attaching or mounting medium known in the art. Matching the length of the PV module 130 with the width of the IGU 100 maximizes the power available to the IGU while also minimizing the unfavorable aesthetic impact of including the PV module 130 on the façade of the building. While the PV module 130 of FIG. 1A is attached to the bottom portion of the frame 120, in other embodiments, the PV module 140 may instead be attached to other portions of the frame, such as the top or sides, while achieving a similar aesthetic quality.

A common construction for the PV module 140 is a glass laminate. Alternative modules may be constructed by mounting solar cells on a fiberglass substrate and encapsulating in polyurethane, resulting in a thin, light, but rugged module.

Figure 1B:
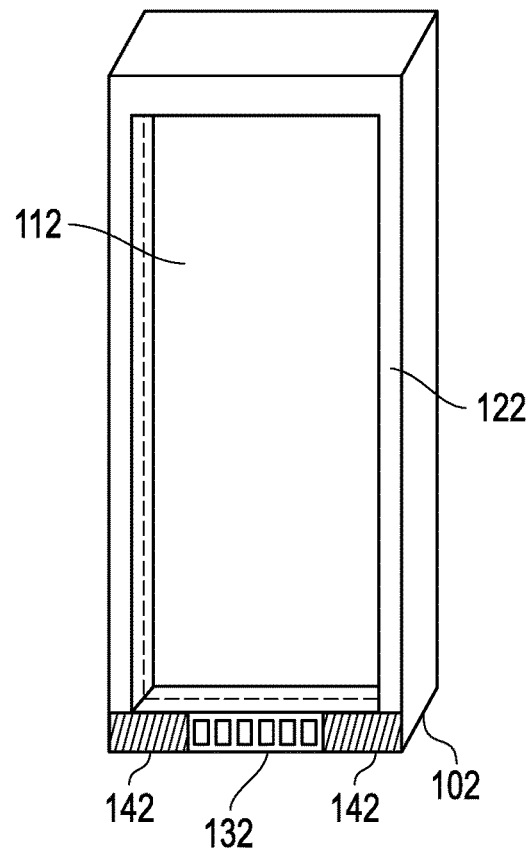

In some instances, absent manufacture of a custom sized PV module, it is believed that available PV module sizes may not fit to a desirable extent across the length or width of the IGU. In such instances, it may be desirable to attach a PV module having a length slightly shorter than the frame and filling in the remaining space with a trim or panel. The trim may be made from extruded plastic or metal (e.g., steel, aluminum), and the color of the trim may be selected to match the color of the PV module to minimize aesthetic impact. For instance, FIG. 1B depicts an IGU 102 having a glazing 112 and frame 122, the IGU 102 being slightly wider than the length on an attached PV module 132. The PV module 132 is centered along the width of the frame 122, and a trim 142 is attached to the frame, thus filling in the exposed portions of the frame 122. The trim 142 may be attached to the frame 122 using any of the same materials and/or methods as used for attaching the PV module, as described in connection with FIG. 1A.

Figure 1C:
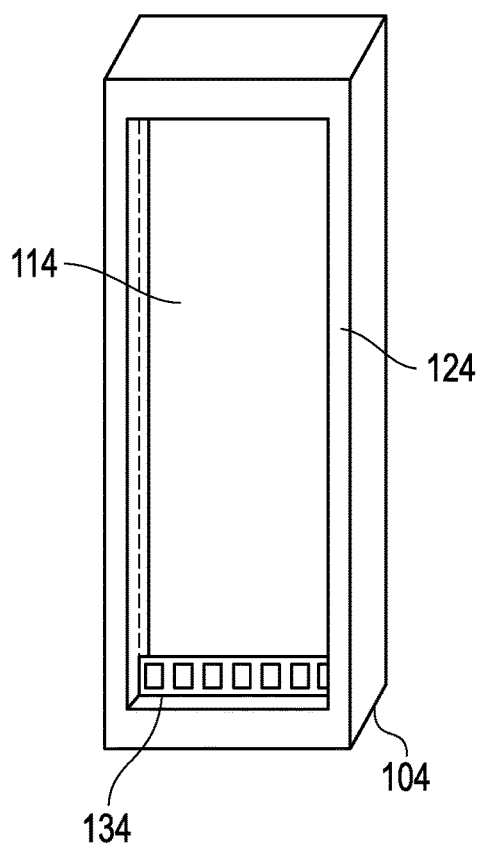
Figure 1D:
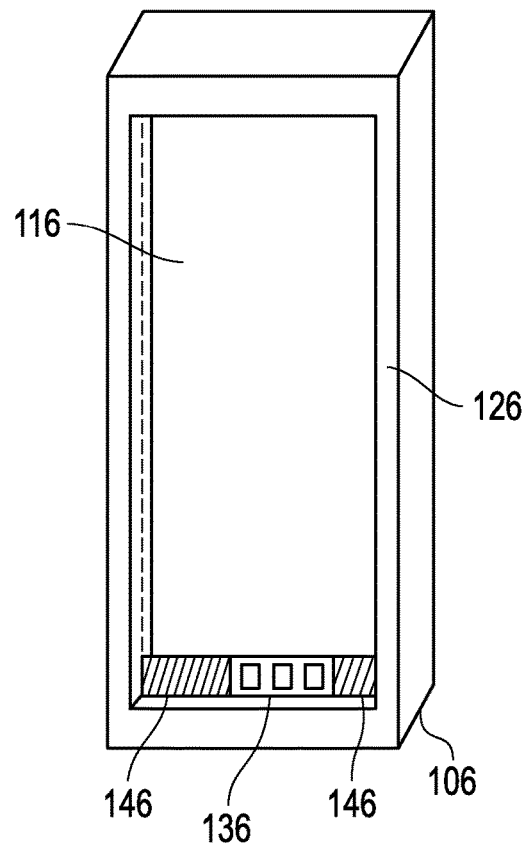

While the examples of FIGS. 1A and 1B demonstrate the ability to attach a PV module to the frame of an IGU, in other embodiments, the PV module (and trim) may be attached to the IGU inside of the frame. Such attachment may be made directly to the glazing. Alternatively, the PV module may be fit into a gap in the IGU left between the glazing and the frame. FIGS. 1C and 1D are perspective views of such arrangements.

In FIG. 1C, the PV module 134 is attached to the glazing 114 (or fit into a gap between the glazing 114 and frame 124) of the IGU 104, and spans the entire width of the glazing 114. Matching the length of the PV module 134 with the width of the glazing 100 similarly minimizes any unfavorable aesthetic impact of including the PV module 134 on the façade of the building.

In FIG. 1D, the PV module 136 is attached to the glazing 116 (or fit into a gap between the glazing 116 and frame 126) of the IGU 106, but does not fully span the entire width of the glazing 116. Rather, the PV module 136 is centered along the width of the glazing 126, and a trim 146 is attached to the glazing (or fit into the remaining gap between the glazing and frame), thus filling in the portions not covered by the PV module 136.

In the above examples of FIGS. 1C and 1D, if the electrochromic glazing is a laminate structure, the PV modules 136 and 146 may be laminated between the glass panes instead of attached thereon.

In the examples of FIGS. 1B and 1D, the PV module is centered with a trim included on either side. However, in some situations, it may be possible to offset the PV module (i.e., not centered) without minimizing the aesthetic impact, or even thereby improving the aesthetic impact. Furthermore, in some such situations, the PV module may be aligned with one end of the IGU such that only one trim in required at the opposite end without minimizing (or even improving) the aesthetic impact.

Even when a PV module having a length equal to the width of the IGU or glazing is available, it may be desirable to use a different length PV module in order to achieve generating an appropriate amount of power for powering the glazing and/or electronics module (discussed further herein). For instance, including a PV module larger than that which would be necessary to operate the glazing may introduce unwanted costs, whereas including a PV module smaller than that which would be necessary may not adequately power the glazing and/or electronics module. Thus, the desired length of the PV module may vary based on the specific power requirements of a particular application. Those skilled in the art will be able to determine the appropriate size of a PV module as necessary to appropriately power the glazing and/or electronics module. Typically, these will comprise between about 2% and about 8% of glass area, assuming cell efficiencies of about 15% to about 20%.

In the present disclosure, the PV module may be made up of smaller solar cell wafers strung together in series. The amount of wafers strung together may be determined based on the desired size (i.e., length) of the PV module and/or on the desired power requirements. Thus, both the size and power capacity of the PV module is fully scalable without requiring custom production of a unique sized module for every IGU.

Figure 2:
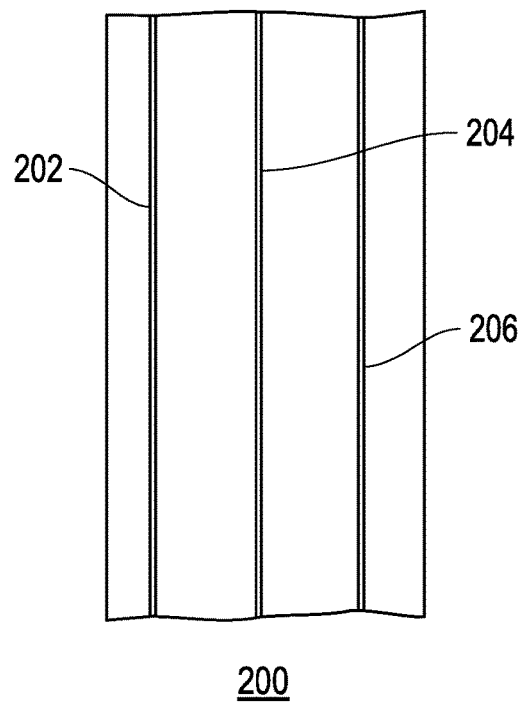
FIG. 2 is a photovoltaic device known in the art.
Figure 3:
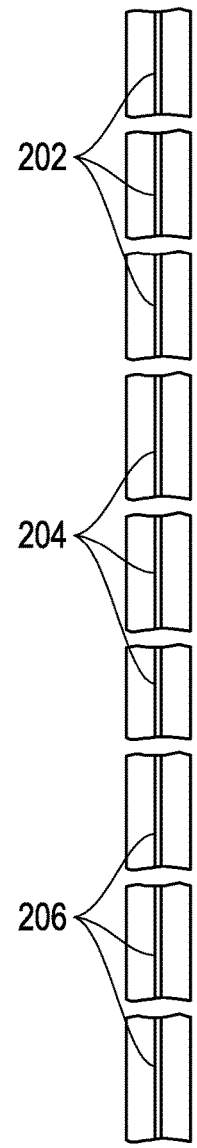
FIG. 3 is another photovoltaic device, made from portions of the device of FIG. 2, in accordance with an aspect of the disclosure.

FIG. 2 illustrates a square shaped PV panel 200 having a length and width of about 150 mm and three busbars 202, 204 and 206. Such panels are well known in the art. Attaching such a panel to the exterior of any of the IGUs of FIGS. 1A-1D would block a significant portion of the glazing, not to mention adversely impact the aesthetic quality of the IGU and building façade. To allow for attachment of the panel to the IGU while minimizing the aesthetic impact of such an arrangement, the panel 200 may be cut up into smaller wafers. In the example of FIG. 3, the panel of FIG. 2 is cut up into nine pieces each about 50 mm by about 50 mm. Each of the pieces may be individually cut such that one of the busbars 202, 204 and 206 bisects (or in other examples, runs through) the respective piece. The pieces may be strung together in series to form a module 300 having a length of about 450 mm and a width of about 50 mm, such that the busbars are aligned in a single line down the length of the module 300. As explained above with respect to FIGS. 1A-1D, the ~450 mm by ~50 mm module may then be more easily attached to the IGU without adversely affecting the aesthetic qualities of the IGU and building façade. In other examples, the module may have a width anywhere from about 25 mm to about 75 mm and still provide a usable range of power. As described above, the module may be as long, or about as long, as the IGU (frame or glazing) width, which itself may come is a wide variety of dimensions.

While the above examples describe PV modules designed from wafers of identical length and width, it is also possible to string together wafers substantially of the same width but varying length to arrive at a uniform width PV array. The use of a few different length wafers can create additional possible overall lengths for the PV module. Generally, these varied wafer lengths are selected to be an even fraction of the size of the panel from which they are cut, in order to minimize overall waste in the cutting process.

FIG. 4 depicts a perspective view of an IGU 400 (which may correspond to any of IGUs 100, 102, 104 and 106) from an interior side of the IGU. As shown in FIG. 4, the IGU 400 includes a controller module 450, which is affixed to the IGU 400 on the interior side in order to protect the module from outdoor environmental conditions (e.g., extreme temperatures, rain). As with the PV module, the controller module may extend across the entire length (or height) of the IGU (or glazing). Specifically, in the example of FIG. 4, the controller module 450 extends across the length of the IGU glazing 410 directly opposite the PV module 440, also to minimize the aesthetic impact of attaching the controller to the IGU. The controller module 450 may further include a cover panel 460 to shield the control electronics (FIG. 5) and further minimize aesthetic impact.

Those skilled in the art will be able to design an appropriate controller module combining those features typically associated with solar-powered electronics and variably transmissive devices. Typical components known to those of skill in the art include (i) microprocessor control, typically using an embedded 8- or 16-bit microcontroller such as those made by MicroChip or Cypress Semiconductor; (ii) linear or switching voltage regulators to provide variable voltage to the electrochromic glazing; (iii) wireless communication modules; (iv) linear or switching voltage regulators to convert photovoltaic voltage to circuit requirements; (v) battery charge/discharge control components; and (vi) batteries or super-capacitors to permit faster switching in low light. Any of these features may be used alone or in combination to produce an appropriate electronics module. In some embodiments, the microprocessor manages all functions of voltage conversion, battery control, and communications (wires or wireless). In some embodiments, the wireless module includes a transceiver circuit and an antenna, such as for RF communications to remote management devices/information sources (e.g., a building management system, lighting and temperature control systems, a user-controlled remote device or panel, etc.). In other embodiments, the electronics module could be combined with other optional components, such as a battery. Controller modules are described in greater detail in commonly owned copending U.S. application Ser. No. 13/354,863 (therein termed an "electronics module"), the disclosure of which is hereby incorporated herein in its entirety.

FIG. 5 is an example schematic diagram of the components of the controller module 450 in which the module includes a microcontroller 510, radio 520 and battery 530. The arrangement of FIG. 5 allows for each of the components to be operated in the manner described in commonly owned copending U.S. application Ser. No. 13/354,863 while fitting inside the controller module directly opposite the PV module. This allows for ease of access to the controller module components without significantly jeopardizing the aesthetic appearance of the IGU, even from the interior of the building façade.

The particular arrangement of the components shown in FIG. 4 is not a strict requirement, as the components may be arranged in other patterns or designs if so desired or so dictated by the desired dimensions of the IGU or opposing PV module.

As shown in FIG. 5, a significant amount of space within the controller module 450 is set aside for the battery 530. The particular size battery utilized in the controller module may depend on the particular power requirements of the IGU, including the controller module and glazing. The battery size may be scaled by combining more or fewer battery cells together to form the battery 530.

Figure 6:
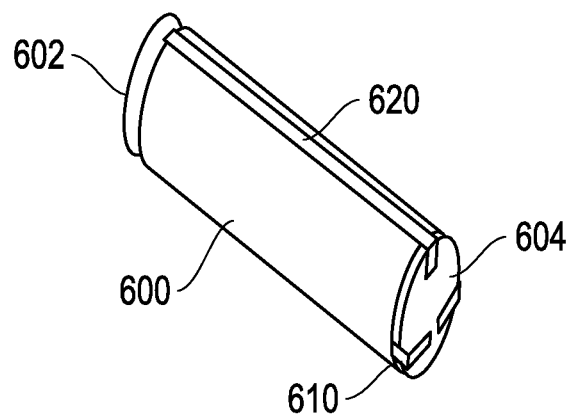
FIG. 6 is a schematic view of a battery cell in accordance with an aspect of the disclosure.
Figure 7:
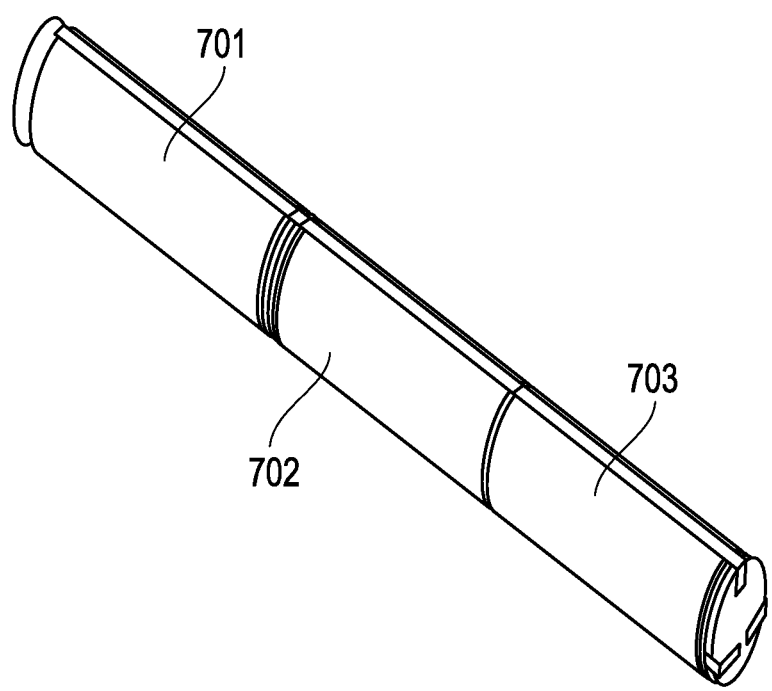
FIG. 7 is a schematic view of multiple battery cells electrically coupled in parallel in accordance with an aspect of the disclosure.

FIG. 6 is a perspective view of a battery module 600 in accordance with an aspect of the disclosure. The battery module 600 has a predetermined circumference C and length L extending from a back end 602 to a front end 604 of the module 600, and includes a positive terminal 610 and ground terminal 620. Each of the positive and ground terminals extends across the length L of the module 600. Extending the terminals 610 and 620 across L allows for multiple modules to be connected in parallel while the module are placed end to end in a single line. FIG. 7 illustrates the electrical connection of three modules 701, 702 and 703 in parallel. The three modules 701-703 carry three times the current, and thus three times the power, as the single module 600 of FIG. 6. If more power is desired, additional modules may be connected end-to-end in line. Conversely, if less power is required, fewer modules may be used.

In another embodiment, instead of the battery modules including terminals, each module may include wires for connecting the battery cells of one module to the battery cells of another module. The modules may still be linked in parallel using the wires, and may still be arranged end-to-end. In effect, the arrangement of the battery would still appear largely similar to that of FIG. 7, but with positive and ground wires connecting the batteries instead of positive and ground terminals.

In a further embodiment, if a higher voltage is desired than is provided by the individual battery modules, the battery modules may be grouped, with each group of o ne or more battery modules being electrically connected to one another in series instead of in parallel, to achieve the specific voltage desired. Each group of battery modules may further be connected to one another in parallel to achieve the specific power capacity requirements for the battery.

Sizing and scaling for the PV module and battery may be determined according to the specific power requirements and environment details of a given IGU. For example, a south-facing 15 ft$^2$ IGU in Golden, Colo., USA, expected to only respond automatically to daylight, might only require a 3 W (peak) solar panel and 8 Wh lithium-ion battery, whereas an east-facing 15 ft$^2$ IGU in Boise, Id., USA, expected to be manually tinted for glare 10% of the day, might need a 4.5 W solar panel and 12 Wh battery. Thus, the PV module used in Boise may scaled to include more 50 mm solar cell wafers than the module used in Golden, and the battery used in Boise may also be scaled to include more battery cells, to achieve the high solar panel wattage (due to increase voltage) and higher battery capacity (due to increased battery current)

While the above examples describe use of the improved solar power device on building façades, this technology could be adapted f or use of other parts of a building (or housing), such as skylights, as well as in other applications, such as in the transportation industry, e.g., for use in vehicles.

Other aspects of the disclosure are described in the attachment herein, titled "Solar-Powered Device with Range of Sizes and Power Requirements" (7 pages), the disclosure of which is hereby incorporated by reference herein in its entirety.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1. A photovoltaic assembly comprising an insulated glazing unit including a variably transmissive glazing; and a photovoltaic module attached to the insulated glazing unit and electrically coupled to the variably transmissive glazing, the photovoltaic module extending from a first end of the insulated glazing unit to an opposing second end of the insulated glazing unit, wherein the length of the photovoltaic module is substantially the same as the distance between the first and second ends of the insulated glazing unit.

Embodiment 2. The photovoltaic assembly of embodiment 1, wherein the photovoltaic module comprises an electrically active portion including at least one solar cell and an electrically inactive portion, the electrically active portion and electrically inactive portion having substantially the same width.

Embodiment 3. The photovoltaic assembly of embodiment 2, wherein the photovoltaic module comprises two electrically inactive portions and wherein the electrically active portion is centered between said electrically inactive portions such that the widthwise midpoint of the electrically active portion is in alignment with the widthwise midpoint of the insulated glazing unit.

Embodiment 4. The photovoltaic assembly of embodiment 1, wherein the photovoltaic module comprises a plurality of solar cell wafers electrically coupled in series to one another, each solar cell wafer having a common length and common width.

Embodiment 5. The photovoltaic assembly of embodiment 1, wherein the insulated glazing unit further includes a frame, the frame at least partially enclosing the glazing, the first and second ends of the insulated glazing unit being opposing ends of the frame, wherein the photovoltaic module is attached to the frame.

Embodiment 6. A window transmissivity control assembly comprising the photovoltaic assembly of embodiment 1, wherein the photovoltaic assembly is attached to an exterior face portion of the insulated glazing unit; and a control module attached to an interior face portion of the insulated glazing unit, the control module including a control circuit for controlling transmissivity of the glazing, and a battery for providing power to the glazing.

Embodiment 7. The window transmissivity control assembly of embodiment 6, wherein the control module is attached to the interior face portion of the insulated glazing unit opposite the exterior face portion to which the photovoltaic module is attached.

Embodiment 8. The window transmissivity control assembly of embodiment 6, wherein the battery includes a plurality of battery cells, each battery cell having a front end and a back end, wherein the plurality of battery cells are aligned in a front-to-back single row alignment.

Embodiment 9. The window transmissivity control assembly of embodiment 8, wherein the plurality of battery cells are electrically coupled to one another in parallel.

Embodiment 10. The window transmissivity control assembly of embodiment 6, wherein the control module extends from the first end of the insulated glazing unit to the opposing second end, and wherein the length of the control module is substantially the same as the distance between the first and second ends of the insulated glazing unit.

Embodiment 11. A photovoltaic assembly comprising and an insulated glazing unit including a variably transmissive glazing; and a photovoltaic module overlaying and electrically coupled to the variably transmissive glazing, the photovoltaic module extending from a first end of the glazing to an opposing second end of the glazing, wherein the length of the photovoltaic module is substantially the same as the distance between the first and second ends of the glazing.

Embodiment 12. The photovoltaic assembly of embodiment 11, wherein the photovoltaic module comprises an electrically active portion including at least one solar cell and an electrically inactive portion on either side of the electrically active portion, the electrically active portion and electrically inactive portion having substantially the same width.

Embodiment 13. The photovoltaic assembly of embodiment 11, wherein the photovoltaic module comprises a plurality of solar cell wafers electrically coupled in series to one another, each solar cell wafer having a common length and common width.

Embodiment 14. The photovoltaic assembly of embodiment 13, wherein each solar cell wafer has a width of about 50 millimeters.

Embodiment 15. A window transmissivity control assembly comprising the photovoltaic assembly of embodiment 11, wherein the photovoltaic assembly is attached to an exterior face portion of the glazing; and a control module attached to an interior face portion of one of the glazing and the insulated glazing unit, the control module including a control circuit for controlling transmissivity of the glazing, and a battery for providing power to the glazing.

Embodiment 16. The window transmissivity control assembly of embodiment 15, wherein the control module is attached to the interior face portion of the glazing opposite the exterior face portion to which the photovoltaic module is attached.

Embodiment 17. The window transmissivity control assembly of embodiment 15, wherein the battery includes a plurality of battery modules, each battery module having a front end and a back end, wherein the plurality of battery modules are aligned in a front-to-back single row alignment.

Embodiment 18. The window transmissivity control assembly of embodiment 17, wherein the plurality of battery cells are electrically coupled to one another in parallel.

Embodiment 19. The window transmissivity control assembly of embodiment 15, wherein the length of the control module is substantially the same as the width of whichever of the insulated glazing unit and the glazing to which the control module is attached.

Embodiment 20. A window transmissivity control assembly comprising a photovoltaic power source electrically coupled to an insulated glazing unit; and a battery power source electrically coupled to the insulated glazing unit, wherein the photovoltaic power source includes a plurality of solar cell wafers having a common width, the plurality of solar cell wafers coupled to one another lengthwise to form a solar cell array having said common width, wherein said battery power source includes a plurality of battery modules having a common length and a common diameter, and wherein the length dimension of the solar cell wafers is substantially parallel to the length dimension of the battery modules.

Embodiment 21. The window transmissivity control assembly of embodiment 20, wherein the common length dimension of the solar cell wafers and battery modules is substantially parallel to a width dimension of the insulated glazing unit.

Embodiment 22. The window transmissivity control assembly of embodiment 20, wherein said assembly is installed into one of a building façade, an architectural skylight, and a vehicle.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A photovoltaic assembly, comprising:
an insulated glazing unit including a variably transmissive glazing;
a photovoltaic module attached to an outermost surface of the insulated glazing unit and electrically coupled to the variably transmissive glazing, the photovoltaic module extending between a first end of the insulated glazing unit and an opposing second end of the insulated glazing unit, wherein the photovoltaic module has a length smaller than a distance between the first and second ends of the insulated glazing unit;
a trim proposed between an end of the photovoltaic module and one of the first and second ends of the insulated glazing unit; and
a control module attached to an interior face portion of the insulated glazing unit.

2. The photovoltaic assembly of claim 1, wherein the photovoltaic module comprises at least one solar cell, and wherein the photovoltaic module and the trim are in alignment.

3. The photovoltaic assembly of claim 1, wherein the photovoltaic module is centered between the first and second ends of the insulated glazing unit such that the widthwise midpoint of the photovoltaic is in alignment with the widthwise midpoint of the insulated glazing unit.

4. The photovoltaic assembly of claim 1, wherein the photovoltaic module comprises a plurality of solar cell wafers electrically coupled in series to one another, each solar cell wafer having a common length and common width.

5. The photovoltaic assembly of claim 1, wherein the insulated glazing unit further includes a frame, the frame at least partially enclosing the variably transmissive glazing, the first and second ends of the insulated glazing unit being opposing ends of the frame, wherein the photovoltaic module extends along an exterior surface of the frame.

6. A window transmissivity control assembly, comprising the photovoltaic assembly of claim 1, wherein the control module comprises:
a control circuit for controlling transmissivity of the glazing; and
a battery for providing power to the variably transmissive glazing.

7. The window transmissivity control assembly of claim 6, wherein the control module is attached to the interior face portion of the insulated glazing unit directly opposite where the photovoltaic module is attached.

8. The window transmissivity control assembly of claim 6, wherein the battery includes a plurality of battery cells, each battery cell having a front end and a back end, wherein the plurality of battery cells are aligned in a front-to-back single row alignment.

9. The window transmissivity control assembly of claim 8, wherein the plurality of battery cells are electrically coupled to one another in parallel.

10. The window transmissivity control assembly of claim 6, wherein the control module extends from the first end of the insulated glazing unit to the opposing second end, and wherein the length of the control module is the same as the distance between the first and second ends of the insulated glazing unit.

11. A photovoltaic assembly, comprising:
an insulated glazing unit including a variably transmissive glazing; and
a photovoltaic module overlaying and electrically coupled to the variably transmissive glazing, the photovoltaic module extending continuously between a first end of the variably transmissive glazing and an opposing second end of the variably transmissive glazing,
wherein the photovoltaic module comprises at least one solar cell, and wherein a trim is disposed on either side of the photovoltaic module, the photovoltaic module and the trims are in alignment.

12. The photovoltaic assembly of claim 11, wherein the photovoltaic module comprises a plurality of solar cell wafers electrically coupled in series to one another, each solar cell wafer having a common length and common width.

13. A window transmissivity control assembly, comprising:
the photovoltaic assembly of claim 11, wherein the photovoltaic assembly is attached to an exterior face portion of the variably transmissive glazing;
a control module attached to an interior face portion of one of the variably transmissive glazing and the insulated glazing unit, the control module including:
a control circuit for controlling transmissivity of the variably transmissive glazing; and
a battery for providing power to the variably transmissive glazing.

14. The window transmissivity control assembly of claim 13, wherein the control module is attached to the interior face portion of the variably transmissive glazing opposite the exterior face portion to which the photovoltaic module is attached.

15. The window transmissivity control assembly of claim 13, wherein the battery includes a plurality of battery modules, each battery module having a front end and a back end, wherein the plurality of battery modules are aligned in a front-to-back single row alignment.

16. The window transmissivity control assembly of claim 13, wherein the length of the control module is the same as the width of whichever of the insulated glazing unit and the variably transmissive glazing to which the control module is attached.

17. A window transmissivity control assembly, comprising:
a photovoltaic power source electrically coupled to an insulated glazing unit; and
a battery power source electrically coupled to the insulated glazing unit,
wherein the photovoltaic power source includes a plurality of solar cell wafers having a common width, the plurality of solar cell wafers coupled to one another lengthwise to form a solar cell array having said common width,
wherein said battery power source includes a plurality of battery modules having a common length and a common diameter, wherein the length of each battery module extends from a back end to a front end of the battery module, and the plurality of battery modules are in a front-to-back alignment, and said battery power source includes one row of the plurality of battery modules; and
wherein the length dimension of the solar cell wafers is parallel to the length dimension of the battery modules.

18. The window transmissivity control assembly of claim 17, wherein the common length dimension of the solar cell wafers and battery modules is parallel to a width dimension of the insulated glazing unit.

19. The window transmissivity control assembly of claim 17, wherein said assembly is installed into one of a building façade, an architectural skylight, and a vehicle.

20. The window transmissivity control assembly of claim 17, wherein the plurality of solar cell wafers comprise a busbar; and wherein the busbar bisects a respective solar cell wafer.

* * * * *

UNITED STATES PATENT AND TRADEMARK OFFICE
CERTIFICATE OF CORRECTION

PATENT NO. : 10,170,654 B2  
APPLICATION NO. : 14/743534  
DATED : January 1, 2019  
INVENTOR(S) : Bryan D. Greer et al.

Page 1 of 1

It is certified that error appears in the above-identified patent and that said Letters Patent is hereby corrected as shown below:

In the Claims

Column 11, Line 18, please delete "a trim proposed", and insert --a trim disposed--

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*